(12) United States Patent
Lee

(10) Patent No.: US 7,782,238 B2
(45) Date of Patent: Aug. 24, 2010

(54) ASYMMETRIC PWM SIGNAL GENERATOR, METHOD THEREOF, AND DATA PROCESSING APPARATUS INCLUDING THE SAME

(75) Inventor: Yong-Hee Lee, Yongin-si (KR)

(73) Assignee: Samsung Electronics Co., ltd., Suwon-si (KR)

( * ) Notice: Subject to any disclaimer, the term of this patent is extended or adjusted under 35 U.S.C. 154(b) by 63 days.

(21) Appl. No.: 12/151,901

(22) Filed: May 9, 2008

(65) Prior Publication Data

US 2008/0278361 A1    Nov. 13, 2008

(30) Foreign Application Priority Data

May 10, 2007    (KR) .................. 10-2007-0045516

(51) Int. Cl.
*H03M 3/00*    (2006.01)
(52) U.S. Cl. ......................... 341/143; 341/53
(58) Field of Classification Search ................ 341/144, 341/143, 153, 155, 142, 126, 53; 327/172
See application file for complete search history.

(56) References Cited

U.S. PATENT DOCUMENTS

| | | | |
|---|---|---|---|
| 6,992,610 B2 | 1/2006 | Komarura | 341/152 |
| 7,180,365 B2 | 2/2007 | Lee et al. | 330/10 |
| 7,327,296 B1* | 2/2008 | Gaboriau et al. | 341/143 |
| 7,425,853 B2* | 9/2008 | Andersen et al. | 327/172 |
| 7,515,072 B2* | 4/2009 | Borisavljevic | 341/53 |

OTHER PUBLICATIONS

Korean Patent Application No. 1020040037778 to Lee et al., having Publication date of Dec. 1, 2005 (w/ English Abstract page).
Japanese Patent Application No. 2003-121163 to Komamura, having Publication date of Nov. 18, 2004 (w/ English Abstract page).
Japanese Patent Application No. 2004-236698 to Yonetani, having Publication date of Feb. 23, 2006 (w/ English Abstract page).
Japanese Patent Application No. 2005-143278 to Lee et al., having Publication date of Dec. 8, 2005 (w/ English Abstract page).

* cited by examiner

*Primary Examiner*—Rexford N Barnie
*Assistant Examiner*—Joseph Lauture
(74) *Attorney, Agent, or Firm*—Monica H. Choi

(57) ABSTRACT

A pulse width modulation (PWM) signal generator includes a quantizer for generating a quantized signal by quantizing an input signal, an asymmetric pulse width modulator, and an error correction unit. The asymmetric pulse width modulator generates an asymmetric PWM signal by comparing the quantized signal with a reference signal, with the asymmetric PWM signal being asymmetric with respect to a center of a period of the reference signal. The error correction unit is coupled between the quantizer and the asymmetric pulse width modulator to correct an error generated from the asymmetry of the asymmetric PWM signal. The quantizer is part of a delta sigma modulator having an operating frequency that is twice that of the reference signal.

25 Claims, 12 Drawing Sheets

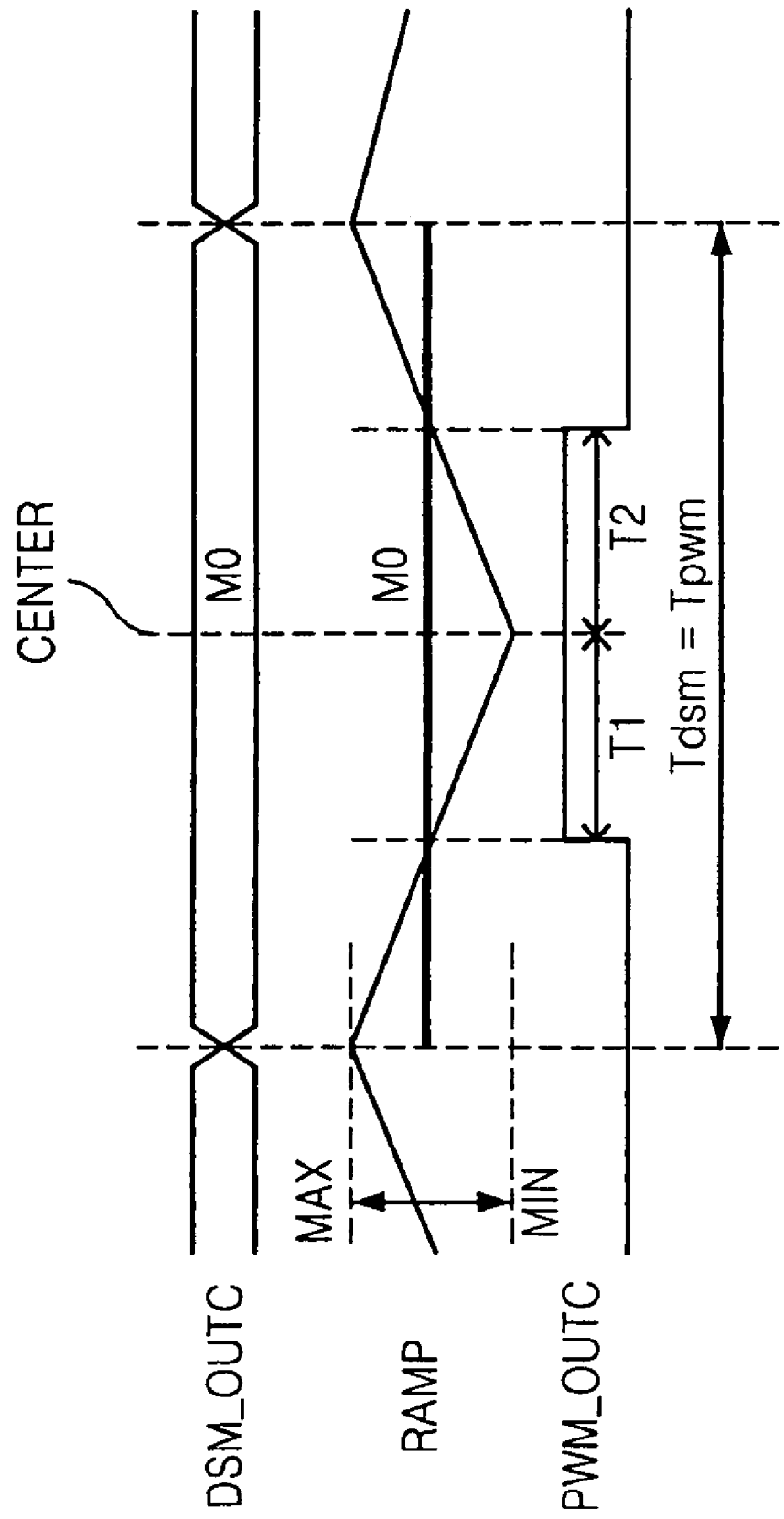
FIG. 4A (CONVENTION ART)

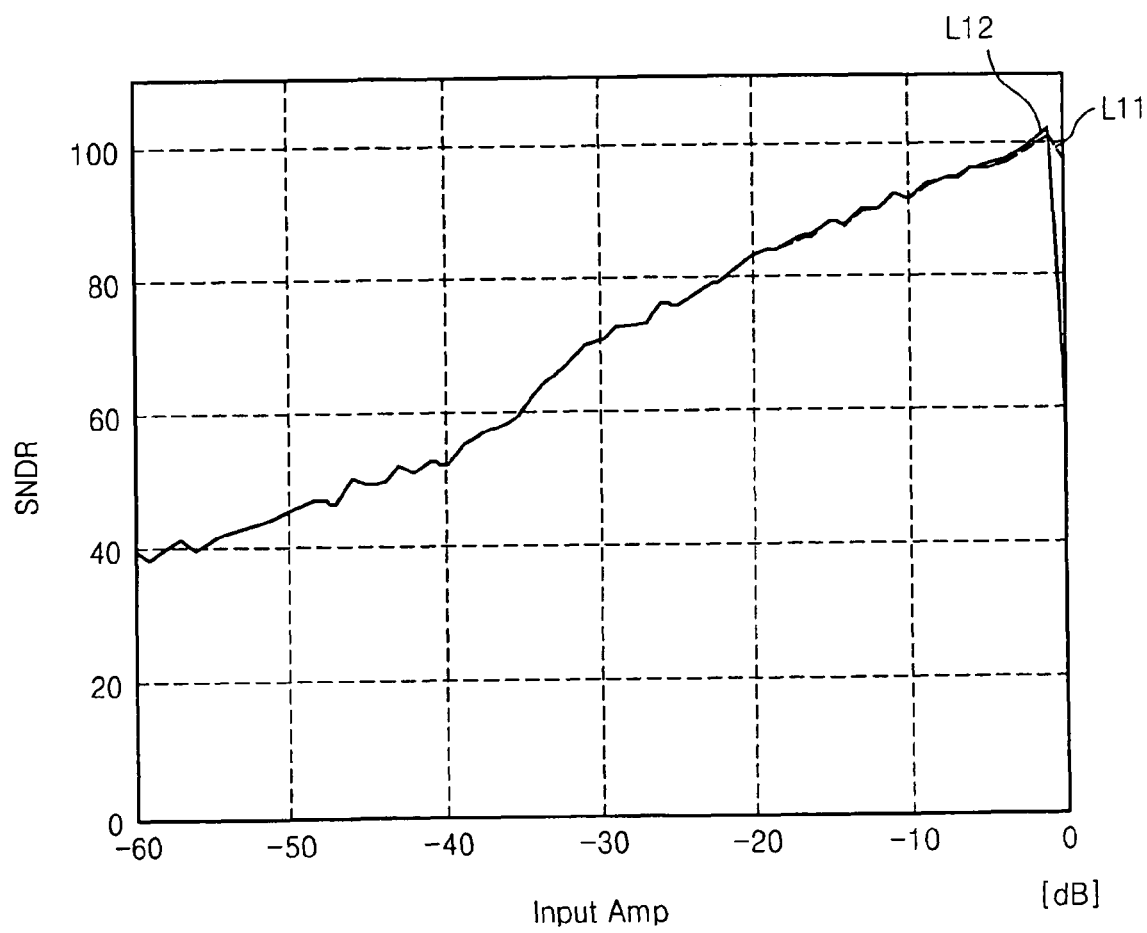
FIG. 7A (CONVENTION ART)

ASYMMETRIC PWM SIGNAL GENERATOR, METHOD THEREOF, AND DATA PROCESSING APPARATUS INCLUDING THE SAME

BACKGROUND OF THE INVENTION

This application claims priority under 35 USC §119 to Korean Patent Application No. 2007-0045516, filed on May 10, 2007 in the Korean Intellectual Property Office, the disclosure of which is incorporated herein in its entirety by reference.

1. Field of the Invention

The present invention relates generally to pulse width modulation (PWM) signal generators, and more particularly to a PWM signal generator that generates an asymmetric PWM signal and a data processing apparatus including the same.

2. Background of the Invention

Pulse width modulation (PWM) is a modulation technique that adjusts the width of pulses according to the level of an input signal. For high efficiency, high resolution, and low power consumption, PWM is widely used in amplifiers (e.g., Class-D amplifiers) or in a data processing apparatus (e.g., audio processing apparatus).

A PWM input signal is a quantized signal. To convert a signal through quantization, delta sigma modulation (DSM) which reduces quantization noise with high resolution is widely used. Especially, in the field of audio amplifiers for driving speakers or headphones requiring high efficiency, Class-D amplification using DSM and PWM is usually used.

DSM is a technology for obtaining high resolution using noise shaping and over-sampling. Noise shaping frequency-shifts quantization noise generated in a signal band during signal quantization into a no-signal band (i.e., a band that is not used). The amount of noise frequency-shifted into the no-signal band is proportional to a loop filter order of a modulator.

Over-sampling is a process of sampling a signal with a frequency significantly higher than the bandwidth of the signal. Since the frequency band is extended by the over-sampling, the level of quantization noise is decreased. Here, as the over-sampling frequency, i.e., an over-sampling ratio (OSR) is increased, the level of the quantization noise is decreased, so that a signal-to-noise-and-distortion ratio (SNDR) in the bandwidth is increased. Accordingly, the SNDR may be increased in the bandwidth of a signal by using the over-sampling and the noise shaping in a DSM device.

A quantized multi-bit signal generated from the DSM device is converted into a pulse width modulation (PWM) signal by a pulse width modulator. Usually, a PWM signal is a digital pulse signal symmetric with respect to the center of a pulse period. In other words, a PWM signal has pulse widths symmetric with respect to such a center of each pulse period. With such a symmetric PWM signal, a linear characteristic is ensured when the PWM signal is converted into an analog signal by a low-pass filter (e.g., an LC filter). In addition with such a symmetric PWM signal, total harmonic distortion (THD) is reduced and a signal-to-noise ratio (SNR) in increased.

For maintaining the symmetry of a PWM signal, the operating frequency of a delta sigma modulator is desired to be same as the central frequency of a PWM signal. Consequently, when the central frequency of a PWM signal is defined, the operating frequency of a DSM device is determined such that the over-sampling ratio and in turn the SNR are restricted.

SUMMARY OF THE INVENTION

In a pulse width modulation (PWM) signal generator and a method thereof according to an aspect of the present invention, a quantizer generates a quantized signal by quantizing an input signal. In addition, the PWM signal generator includes an asymmetric pulse width modulator and an error correction unit. The asymmetric pulse width modulator generates an asymmetric PWM signal by comparing the quantized signal with a reference signal, with the asymmetric PWM signal being asymmetric with respect to a center of a period of the reference signal. The error correction unit is coupled between the quantizer and the asymmetric pulse width modulator to correct an error generated from the asymmetry of the asymmetric PWM signal.

In an embodiment of the present invention, the error correction unit has a transfer function that is one of an inverse of a transfer function of the asymmetric pulse width modulator or an inverse of a transfer function of the error generated from the asymmetry of the asymmetric PWM signal. For example, the error correction unit has a transfer function of $1+Z^{-1}$.

In another embodiment of the present invention, the error correction unit includes a delayer and an adder. The delayer is for delaying the quantized signal to generate a delayed quantized signal. The adder is for adding the quantized signal with the delayed quantized signal to generate an input to the asymmetric pulse width modulator.

In a further embodiment of the present invention, the PWM signal generator includes a delta sigma modulator, including the quantizer, for generating the quantized signal with delta sigma modulation. The delta sigma modulator generates the quantized signal with a first clock frequency that is two times a frequency of the reference signal that is a ramp signal. Additionally, the error correction unit is coupled in open loop between the delta sigma modulator and the asymmetric pulse width modulator.

In a data processing apparatus having pulse width modulation according to another aspect of the present invention, an over-sampler generates an over-sampled signal by sampling a sampled signal at a sampling rate that is N-times a prior sampling rate for generating the sampled signal, with N being an integer that is greater than or equal to 2. In addition, a pulse width modulation (PWM) signal generator of the data processing apparatus includes a quantizer for generating a quantized signal by quantizing the over-sampled signal.

Furthermore, the PWM signal of the signal generator of the data processing apparatus includes an asymmetric pulse width modulator and an error correction unit. The asymmetric pulse width modulator generates an asymmetric PWM signal by comparing the quantized signal with a reference signal, with the asymmetric PWM signal being asymmetric with respect to a center of a period of the reference signal. The error correction unit is coupled between the quantizer and the asymmetric pulse width modulator to correct an error generated from the asymmetry of the asymmetric PWM signal.

A pulse width modulation (PWM) signal generator and a method thereof in another aspect of the present invention includes a quantizer for generating a quantized signal by quantizing an input signal synchronized to a first clock signal. The PWM signal generator further includes an asymmetric pulse width modulator that generates an asymmetric PWM signal by comparing the quantized signal with a reference signal synchronized to a second clock signal. The asymmetric PWM signal is asymmetric with respect to a center of a period of the reference signal, and the first clock signal has a higher frequency than the second clock signal.

In an example embodiment of the present invention, the first clock signal has a frequency that is two times a frequency of the second clock signal.

In another embodiment of the present invention, the reference signal is a ramp signal having the period of the second clock signal. The quantized signal has two different levels for two halves of the period of the ramp signal, and the asymmetric PWM signal is generated by comparing the two different levels with the ramp signal.

In a further embodiment of the present invention, the PWM signal generator includes a delta sigma modulator, including the quantizer, for generating the quantized signal with delta sigma modulation. In an example embodiment of the present invention, the input signal is generated from an over-sampler sampling a sampled signal at a sampling rate that is N-times a prior sampling rate for generating the sampled signal, with N being an integer that is greater than or equal to 2.

In another embodiment of the present invention, the delta sigma modulator includes an adder and a loop filter. The adder is for adding the input signal and the quantized signal. The loop filter is for filtering an output of the adder to generate a filtered signal input by the quantizer.

In this manner, the operating frequency of a quantizer in a delta sigma modulator that generates the quantized signal input to a pulse width modulator is increased higher than a frequency of the reference signal used by the pulse width modulator. Thus, the pulse width modulator generates an asymmetric PWM signal for increasing the SNDR. In addition, an error generated from asymmetry of the asymmetric PWM signal is corrected for further improving the SNDR of the PWM signal.

BRIEF DESCRIPTION OF THE DRAWINGS

The above and other features and advantages of the present invention will become more apparent when described in detailed exemplary embodiments thereof with reference to the attached drawings in which:

FIG. 4A is a timing diagram of signals during operation of a conventional PWM signal generator according to the prior art;

The figures referred to herein are drawn for clarity of illustration and are not necessarily drawn to scale. Elements having the same reference number in FIGS. 1, 2, 3, 4A, 4B, 5, 6, 7A, 7B, 7C, and 8 refer to elements having similar structure and/or function.

DETAILED DESCRIPTION OF THE INVENTION

Figure 1:
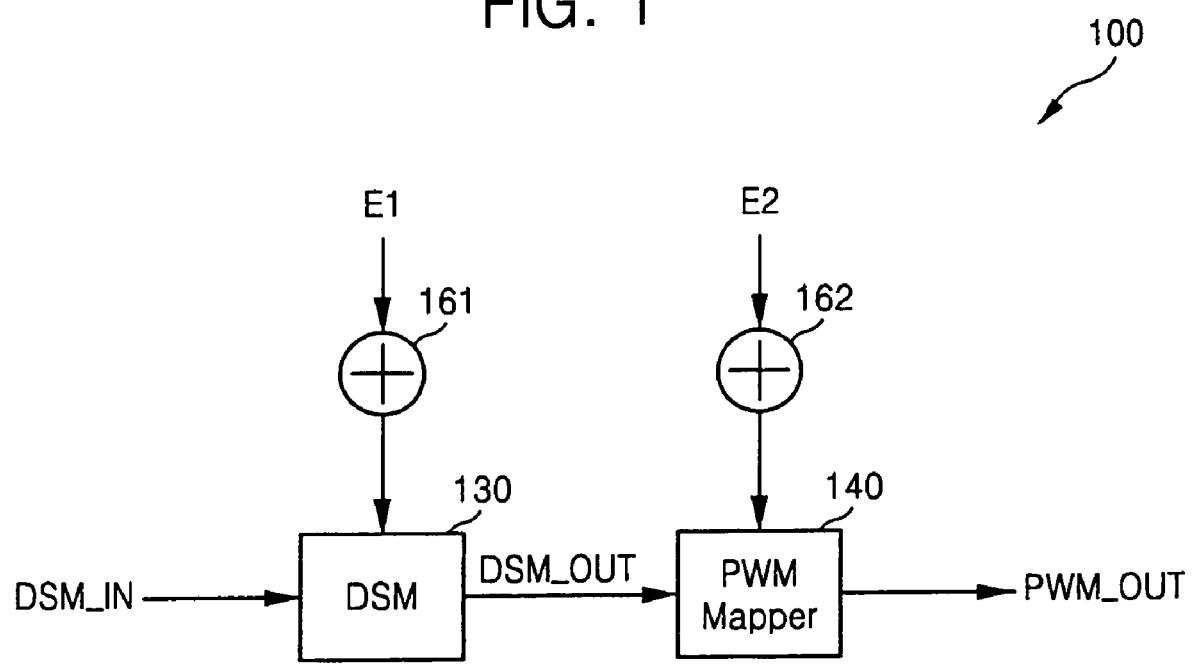
FIG. 1 is a schematic block diagram of a pulse width modulation (PWM) signal generator according to an example embodiment of the present invention.

The present invention is now described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and Will not be interpreted in an idealized or overly formal sense unless expressly so defined herein.

Figure 3:
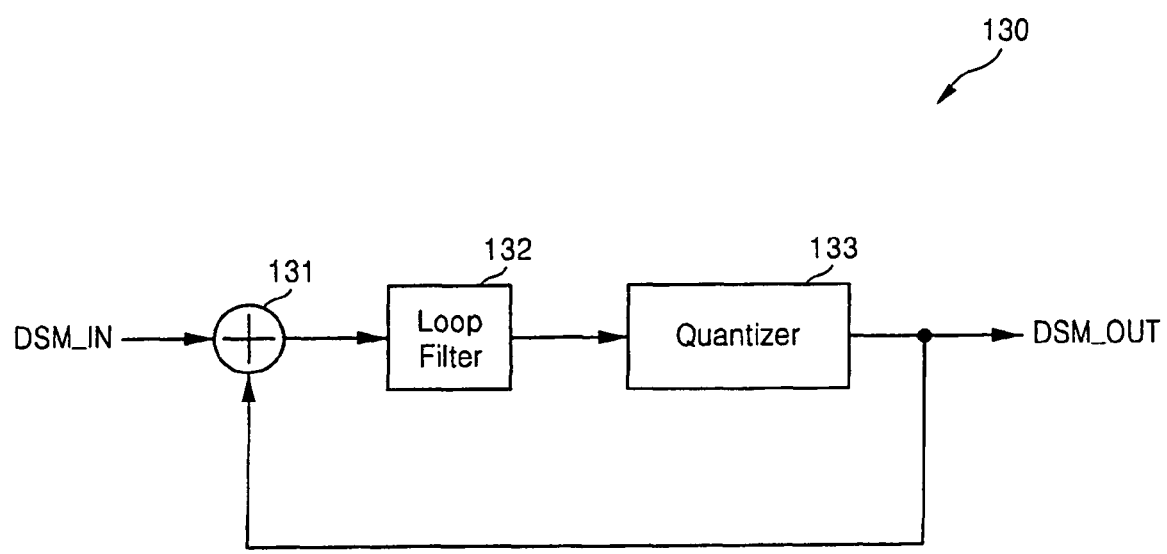
FIG. 3 is a block diagram of a delta sigma modulator (DSM) in the PWM signal generator of FIG. 1, according to an example embodiment of the present invention.

FIG. 1 is a block diagram of a pulse width modulation (PWM) signal generator 100 according to an example embodiment of the present invention. The PWM signal generator 100 includes a delta sigma modulator (DSM) 130 and a pulse width modulator (PWM mapper) 140. FIG. 3 is a block diagram of the DSM 130 of FIG. 1.

The DSM 130 generates a relatively small number of bits by quantizing delta sigma modulation (DSM) input data DSM_IN with high resolution, noise shaping, and over-sampling. The DSM_IN data is quantized into a smaller number of bits than the number of bits of typical pulse-code modulation (PCM) data.

The DSM 130 includes an adder 131, a loop filter 132, and an M-bit quantizer 133. The present invention may be practiced with an over-sampler such as the over-sampler 120 of FIG. 8 coupled to the input of the DSM 130. The adder 131 adds the DSM input data DSM_IN and a delta sigma modulation (DSM) output data DSM_OUT to generate an addition result.

The loop filter 132 filters the addition result of the adder 131 to generate a filtered output. The quantizer 133 quantizes the filtered output from the loop filter 132 into M bits of the DSM output data DSM_OUT that is output by the DSM 130. Here, M is significantly less than the number of bits of typical PCM data. For instance, when PCM data is composed of 16 or 20 bits, the output signal DSM_OUT may be composed of 4 or 5 bits.

The output signal DSM_OUT of the DSM 130 may be expressed by a following Equation (1) in a Z-domain.

$$DSM\_OUT(z)=DSM\_IN(z)+(1-Z^{-1})^N * E1(z), \quad (1)$$

where N is the order of the loop filter 132 and E1(z) is quantization noise of the DSM 130.

The PWM mapper 140 adjusts the width of pulses according to the level of its input signal, i.e., DSM_OUT for modulation. In particular, a period of an output PWM signal PWM_OUT from the PWM mapper 140 is divided into a first half period and a second half period based on a center of the period of PWM_OUT. The PWM mapper 140 performs pulse width modulation during the first half period differently from the second half period to thereby generate the output PWM signal PWM_OUT that is an asymmetric-type PWM signal PWM_OUT which is asymmetric with respect to the center of the period of PWM_OUT.

Referring to FIG. 1, a first adder 161 and a second adder 162 are illustrated to conceptually represent noises E1 and E2 occurring during delta sigma modulation and pulse width modulation, respectively. In other words, the first and second adders 161 and 162 are not elements actually embodied but are illustrated for modeling the occurrence of noises E1 and E2. The noise E1 of the DSM 130 is quantized noise of the DSM 130, and the noise E2 of the PWM mapper 140 is an error (or distortion) component of the asymmetric-type PWM mapper 140.

Figure 2:
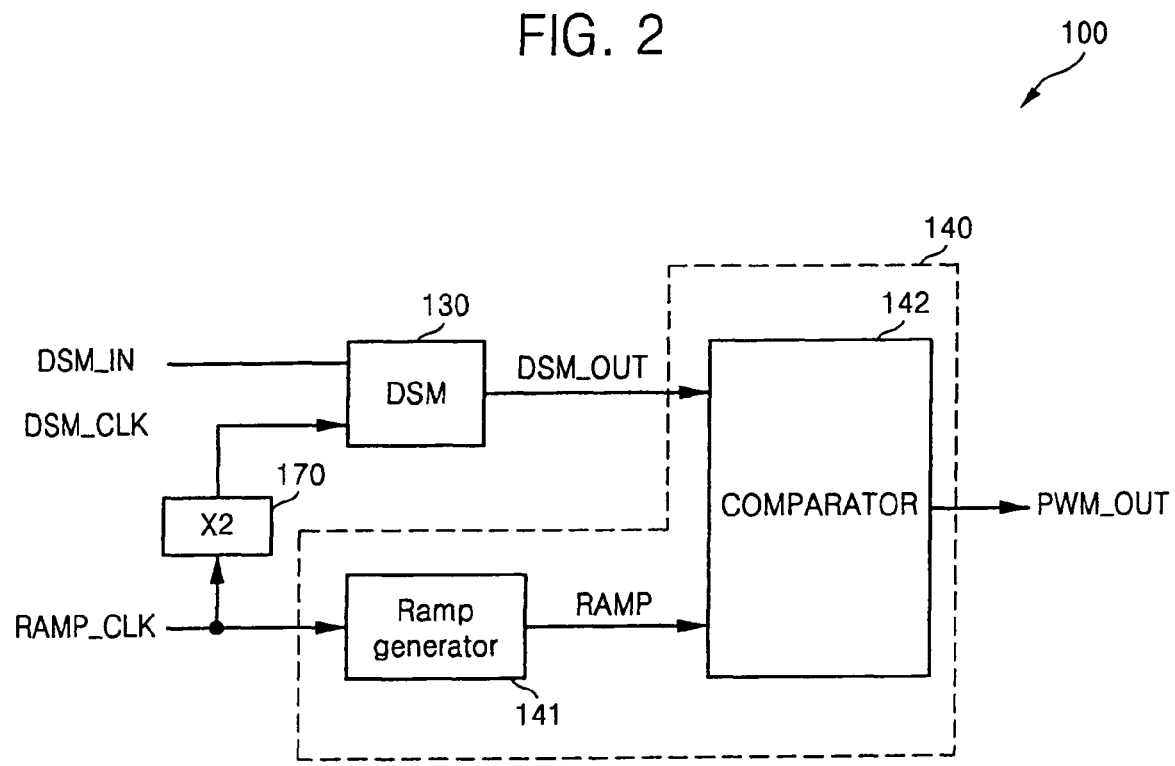
FIG. 2 is a detailed block diagram of the PWM signal generator of FIG. 1, according to an example embodiment of the present invention.

FIG. 2 is a detailed block diagram of the PWM signal generator 100 of FIG. 1. The PWM mapper 140 includes a ramp generator 141 and a comparator 142, in one embodiment of the present invention. The ramp generator 141 generates a triangular ramp signal RAMP, which swings between a first peak value MAX and a second peak value MIN, synchronized to a ramp clock signal RAMP_CLK, as illustrated in FIG. 4B for example.

An operating frequency of the DSM 130 is desired to be two times a central frequency of the PWM mapper 140, according to an embodiment of the present invention. Thus, the DSM 130 operates in response to a DSM clock signal DSM_CLK having a frequency that is two times a frequency of the ramp signal RAMP and a ramp clock signal RAMP_CLK that determines the frequency of the ramp signal RAMP. Accordingly, the PWM signal generator 100 includes a frequency multiplier 170 that multiplies a frequency of the ramp clock signal RAMP_CLK by two to generate the DSM clock signal DSM_CLK having a respective frequency that is two times the frequency of the ramp clock signal RAMP_CLK and that of the ramp signal RAMP.

Figure 4B:
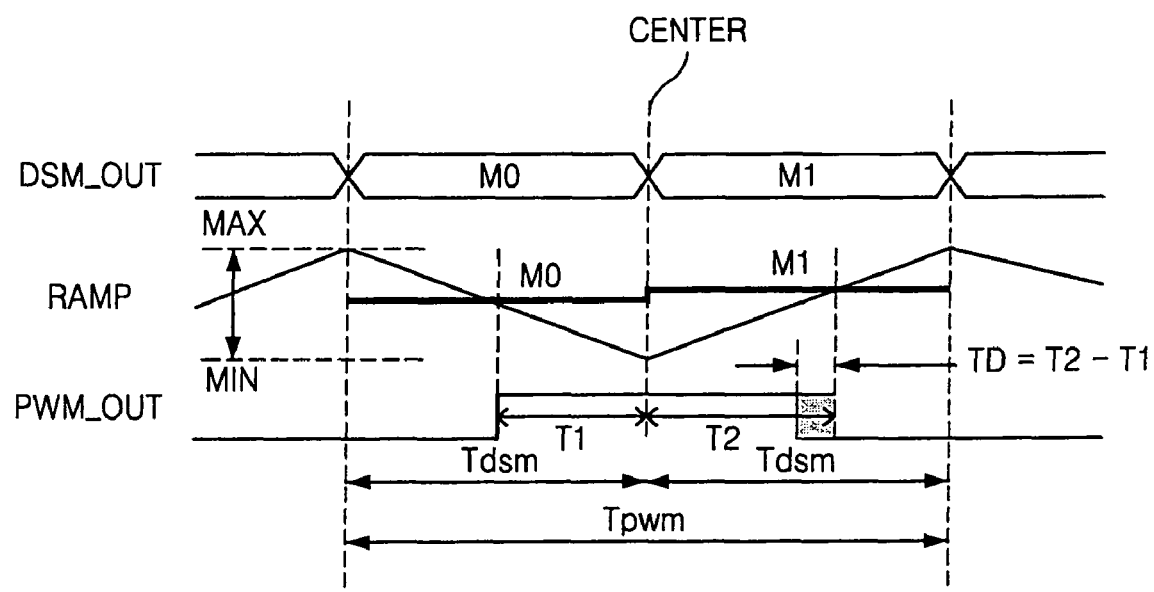
FIG. 4B is a timing diagram of signals during operation of the PWM signal generator of FIGS. 1 and 2, according to an example embodiment of the present invention.

FIG. 4A shows a timing diagram of signals during operation of a conventional pulse width signal generator. FIG. 4B shows a timing diagram of signals during operation of the PWM signal generator 100 of FIG. 1, according to an embodiment of the present invention.

Referring to FIG. 4B, a full period Tdsm of the DSM signal DSM_OUT corresponds to a half period of the ramp signal RAMP, that is, a half period Tpwm/2 of the PWM signal PWM_OUT. The half period Tdsm is generated from the center to the edges of the full period Tpwm of the PWM signal PWM_OUT. The DSM signal DSM_OUT in a first half period of the PWM signal PWM_OUT is different from that in a second half period of the PWM signal PWM_OUT. The DSM signal DSM_OUT in the first half period is referred to as a first signal M0, and the DSM signal DSM_OUT in the second half period is referred to as a second signal M1.

The comparator 142 compares the first signal M0 with the ramp signal RAMP during the first half period of the PWM signal PWM_OUT to generate the PWM signal PWM_OUT during such a first half period. The comparator 142 also compares the second signal M1 with the ramp signal RAMP during the second half period of the PWM signal PWM_OUT to generate the PWM signal PWM_OUT during such a second half period.

When the first signal M0 and the second signal M1 are different from each other with different levels, the PWM signal PWM_OUT is an asymmetric pulse signal that is asymmetric with respect to the center of the period of the PWM signal PWM_OUT.

FIG. 4B illustrates the example case of the respective level of the second signal M1 being higher than the respective level of the first signal M0. In that case, a high-level time period T2 of the PWM signal PWM_OUT during the second half period is greater than a high-level time period T1 of the PWM signal PWM_OUT during the first half period. A difference between the high-level periods T1 and T2 is expressed by TD=T2−T1. The difference TD is not zero except for a case where the level of the first signal M0 is the same as the level of the second signal M1.

In contrast referring to FIG. 4A for the conventional PWM signal generator, a full period Tdsm of a DSM (delta sigma modulation) signal DSM_OUTC is equal to a full period of a ramp signal RAMP which is also a full period Tpwm of a PWM signal PWM_OUTC. Accordingly in FIG. 4A, a level M0 of the DSM signal DSM_OUTC does not change during the full period of the ramp signal RAMP.

Consequently in FIG. 4A, the PWM signal PWM_OUTC generated by comparing the DSM signal DSM_OUTC with the ramp signal RAMP is symmetric with respect to the center of the full period Tpwm of the PWM signal PWM_OUTC. In other words in FIG. 4A, a high-level period T1 of the PWM signal PWM_OUTC during the first half period is the same as a high-level period T2 of the PWM signal PWM_OUTC during the second half period. Accordingly in FIG. 4A, a difference TD between the high-level periods T1 and T2 is expressed by TD=T2−T1=0.

When the operating frequency of the DSM 130 is doubled, an over-sampling ratio (OSR) may be doubled. In other words, the OSR of the asymmetric-type PWM signal generator 100 of the present invention may be two times the OSR of a conventional symmetric-type PWM signal generator in which the operating frequency of a delta sigma modulator is the same as the central frequency of a PWM signal.

When the OSR is doubled, the increment of a signal-to-noise-and-distortion ratio (SNDR) is expressed by the following Equation (2):

$$\text{Increment of SNDR} = 3\{(2*N)+1\}\,[dB] \qquad (2)$$

where N is the order of the loop filter 132. When N is 3, the increment of SNDR is about 21 dB. In other words, when N is 3, the SNDR of the DSM signal DSM_OUT, with the OSR increased by two times, is increased by about 21 dB compared to the SNDR of the DSM signal DSM_OUTC resulting from the conventional lower OSR.

Accordingly, the asymmetric-type PWM signal generator 100 may provide better noise and distortion characteristics than the conventional symmetric-type PWM signal generator. In other words, the characteristics of delta sigma modulation are improved by increasing the operating frequency of the DSM 130, and such improved characteristics are reflected in the PWM signal.

As illustrated in FIG. 4B, with the operating frequency of the DSM 130 being twice of the central frequency (i.e., the frequency of the ramp signal RAMP) of the PWM mapper 140, the PWM signal PWM_OUT is typically an asymmetric-type PWM signal in which the high-level period T1 in the first half period is different from the high-level period T2 in the second half period. An error caused by asymmetric signal components of the PWM signal PWM_OUT may be approximated to a difference between a current PWM signal and a previous PWM signal. In other words, the error E2 of FIG. 1 (hereinafter referred to as an asymmetry error) generated from the asymmetric signal components of the PWM signal PWM_OUT may be approximated by the following Equation (3):

$$TD = T2 - T1 = (1 - Z^{-1}) * \text{PWM\_OUT}(t). \qquad (3)$$

In other words, E2(Z) in the Z-domain may be modeled to have a transfer function of $1-Z^{-1}$. In that case, the error E2 has an effect of high-pass filtering, and therefore, distortion is shaped in a high-frequency band.

Assuming that the transfer function of the DSM 130 is H1(z) and the transfer function of the asymmetric-type PWM mapper 140 having no errors is H2(z)=K (gain factor), the asymmetric-type PWM signal PWM_OUT having the error E2 may be expressed by the following Equation (4) in the z-domain:

$$\text{PWM\_OUT}(z) = \text{PWM\_OUTC}(z) * \{K + E2(z)\}$$

$$PWM\_OUT(z) = K * PWM\_OUTC(z) + E2(z) * PWM\_OUTC(z), \qquad (4)$$

where PWM_OUTC(z) is a z-domain signal in the symmetric-type PWM signal PWM_OUTC that does not have any error caused by asymmetry.

As is shown in Equation (4), the asymmetric-type PWM signal PWM_OUT has an error component of E2(z)*PWM_OUTC(z). When the transfer function of a symmetric-type PWM mapper is 1, PWM_OUTC(z)=DSM_IN(z)+(1−$Z^{-1}$)$^N$*E1(z). Therefore, the signal PWM_OUTC(z) is proportional to the level of the DSM input signal DSM_IN and the quantization noise E1(z) of the DSM 130. Consequently, the asymmetry error E2 proportional to the DSM input signal DSM_IN and the quantization noise E1(z) additionally appears in the asymmetric-type PWM signal generator 100, as illustrated in FIG. 1. In order to further increase the SNDR of the PWM signal PWM_OUT, the error E2 should be corrected.

Figure 5:
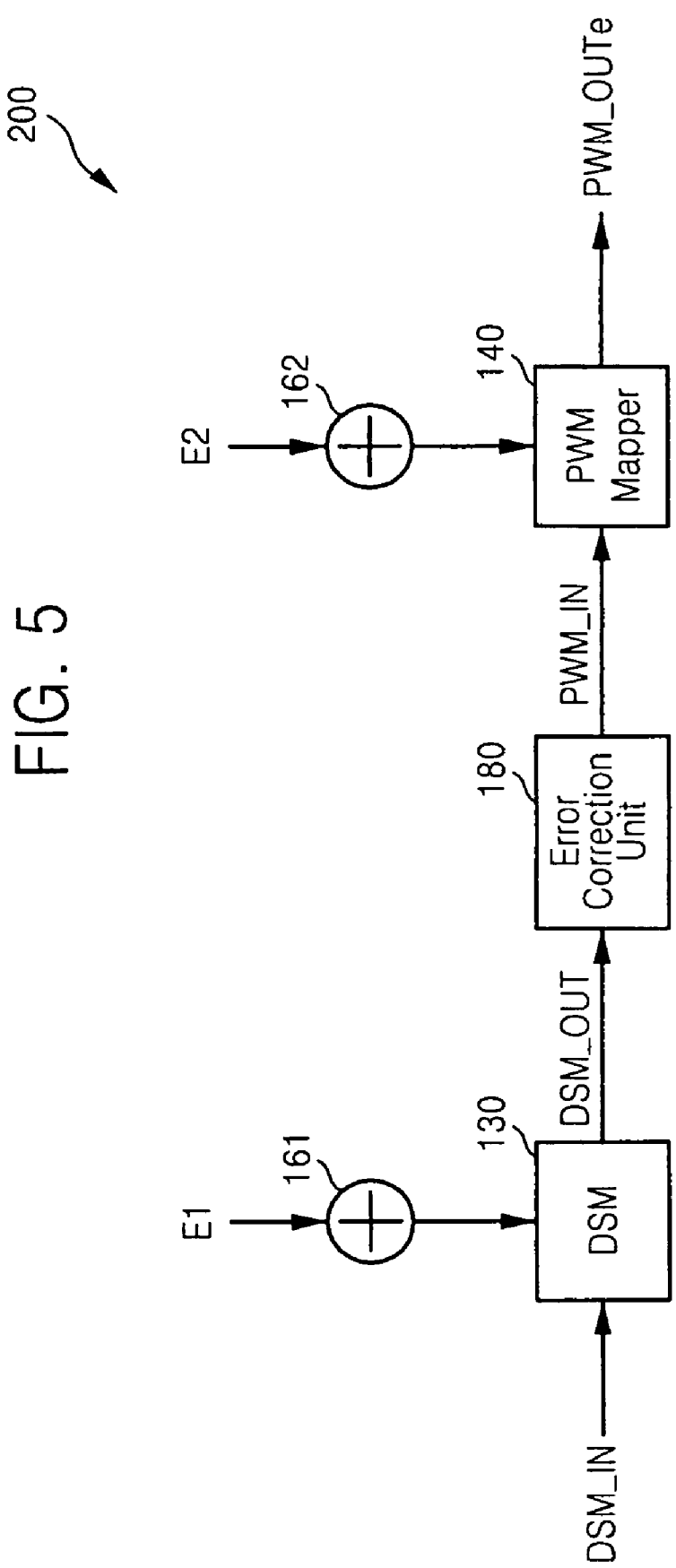
FIG. 5 is a schematic block diagram of a PWM signal generator according to another embodiment of the present invention.
Figure 6:
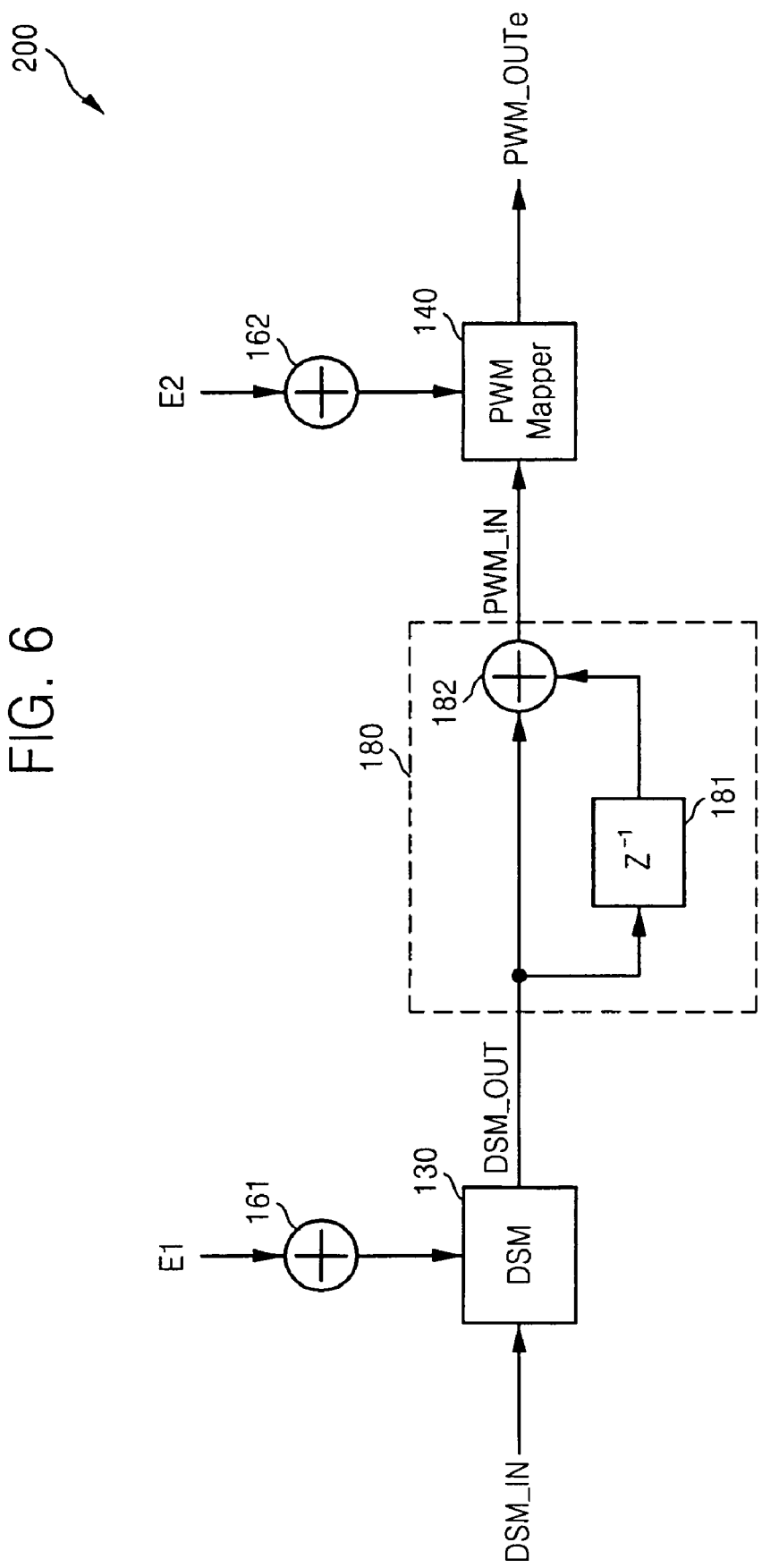
FIG. 6 is a detailed block diagram of the PWM signal generator of FIG. 5, according to an example embodiment of the present invention.

FIG. 5 shows a block diagram of a PWM signal generator 200 according to another embodiment of the present invention. FIG. 6 shows a detailed block diagram of the PWM signal generator 200 of FIG. 5, according to an example embodiment of the present invention.

The PWM signal generator 200 includes the DSM 130, the PWM mapper 140, and an error correction unit 180 for correcting the asymmetry error E2. An ideal transfer function EC(z) of the error correction unit 180 for correcting the asymmetry error E2 may be expressed by the following Equation (5):

$$EC(Z) = 1/\{J + E2(z)\}, \qquad (5)$$

where J is a constant (e.g., a real number such as 0, 1, or 1.5).

When J=K(gain factor)=H2(z) (which is the transfer function of the asymmetric-type PWM mapper 140 having no errors), K+E2(z) becomes the transfer function of the asymmetric-type PWM mapper 140 having an asymmetry error. In that case, the transfer function EC(z) of the error correction unit 180 is the inverse of the transfer function K+E2(z) of the asymmetric-type PWM mapper 140 having the asymmetry error.

Alternatively, when J=0, EC(z)=1/E2(z), and therefore, the transfer function EC(z) of the error correction unit 180 is the inverse of the transfer function E2(z) of the asymmetry error. Accordingly, the error correction unit 180 may be embodied to have a transfer function corresponding to the inverse of the transfer function of the asymmetric-type PWM mapper 140 or the transfer function E2(z) of the asymmetry error.

When J=K(gain factor), an error-corrected PWM signal PWM_OUTe may be expressed by the following Equation (6) in the z-domain:

$$\text{PWM\_OUTe}(z) = \{\text{DSM\_OUT}(z)/\{K+E2(z)\}\} * \{K+E2(z)\}. \qquad (6)$$

Accordingly, an error-corrected asymmetric-type PWM output signal may be expressed by PWM_OUTe(z)=DSM_OUT(z).

As is shown in Equation (6), the asymmetry error E2(z) is corrected by the error correction unit 180, and therefore, the DSM signal DSM_OUT appears in the PWM signal PWM_OUTe without distortion. In other words, even with the noise and distortion characteristics of the DSM signal DSM_OUT being improved (such as when the SNDR is increased), the characteristics of the PWM signal PWM_OUTe may also be improved even through the asymmetric-type PWM mapper 140. Accordingly, the noise and distortion characteristics improved by doubling the OSR of the DSM 130 may be maintained.

The error correction unit 180 may not fully correct the error E2(z) but just approximately correct such an error because of hardware implementation features. Even in that case, since the transfer function K+E2(z) of the asymmetric-type PWM mapper 140 having the error E2 is divided by a function K+E2'(z) very similar to the transfer function K+E2(z) in Equation (6), better performance characteristics may be obtained when the error correction unit 180 is included than when the error correction unit 180 is not included. Here, E2'(z) is a correction value approximated to E2(z).

The error correction unit 180 operates through an open loop path between the DSM 130 and the PWM mapper 140 such that the error correction unit 180 does not influence and/or is not influenced by the transfer characteristics of the feedback circuit of the DSM 130. Accordingly, the error correction unit 180 does not affect system stability and the characteristics of the DSM 130.

If E2(z) is modeled to have a transfer function of $1-Z^{-1}$, the error correction unit 180 may be implemented to have a transfer function of $1/(1-Z^{-1})$. Referring to FIG. 6, the error correction unit 180 is implemented as a low-pass filter to have a transfer function of $1+Z^{-1}$, according to an example embodiment of the present invention. In that case, the error correction unit 180 includes a delayer 181 and an adder 182. The delayer 181 delays the DSM signal DSM_OUT. The adder 182 adds an output of the delayer 181 and the DSM signal DSM_OUT to generate an added signal that is input by the PWM mapper 140.

Since bit truncation cannot be performed on the DSM signal DSM_OUT due to the characteristics of the DSM 130, the number of bits in an output signal of the error correction unit 180, i.e., a PWM input signal PWM_IN, may be continuously integrated when the error correction unit 180 is implemented to have the inverse of $1-Z^{-1}$, i.e., $1/(1-Z^{-1})$, as the transfer function. At this time, the number of bits in the PWM input signal PWM_IN is continuously increased and may go beyond the normal range of a ramp signal RAMP used for PWM.

If the normal range of the ramp signal RAMP is set to be large, an operating frequency required for PWM is increased, making the implementation of hardware difficult. Accordingly, the error correction unit 180 may be implemented in a form of a low-pass filter instead of an integrator by adding two adjacent signals (e.g., a current signal and a previous signal) according to an embodiment of the present invention.

Figure 7B:
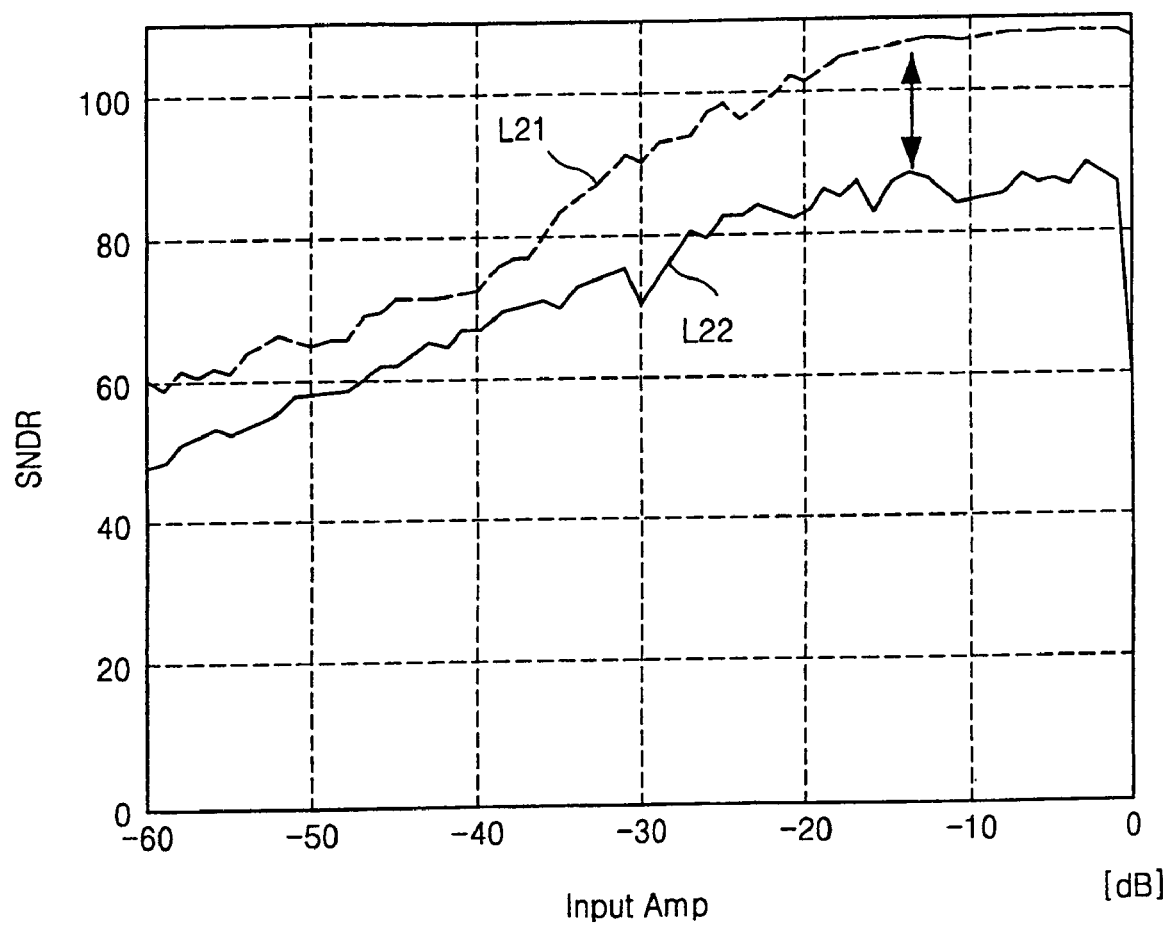
FIGS. 7A, 7B, and 7C are graphs of simulation results for comparing a signal-to-noise-and distortion ratio (SNDR) in a PWM signal generator according to embodiments of the present invention with an SNDR in a conventional PWM signal generator.
Figure 7C:
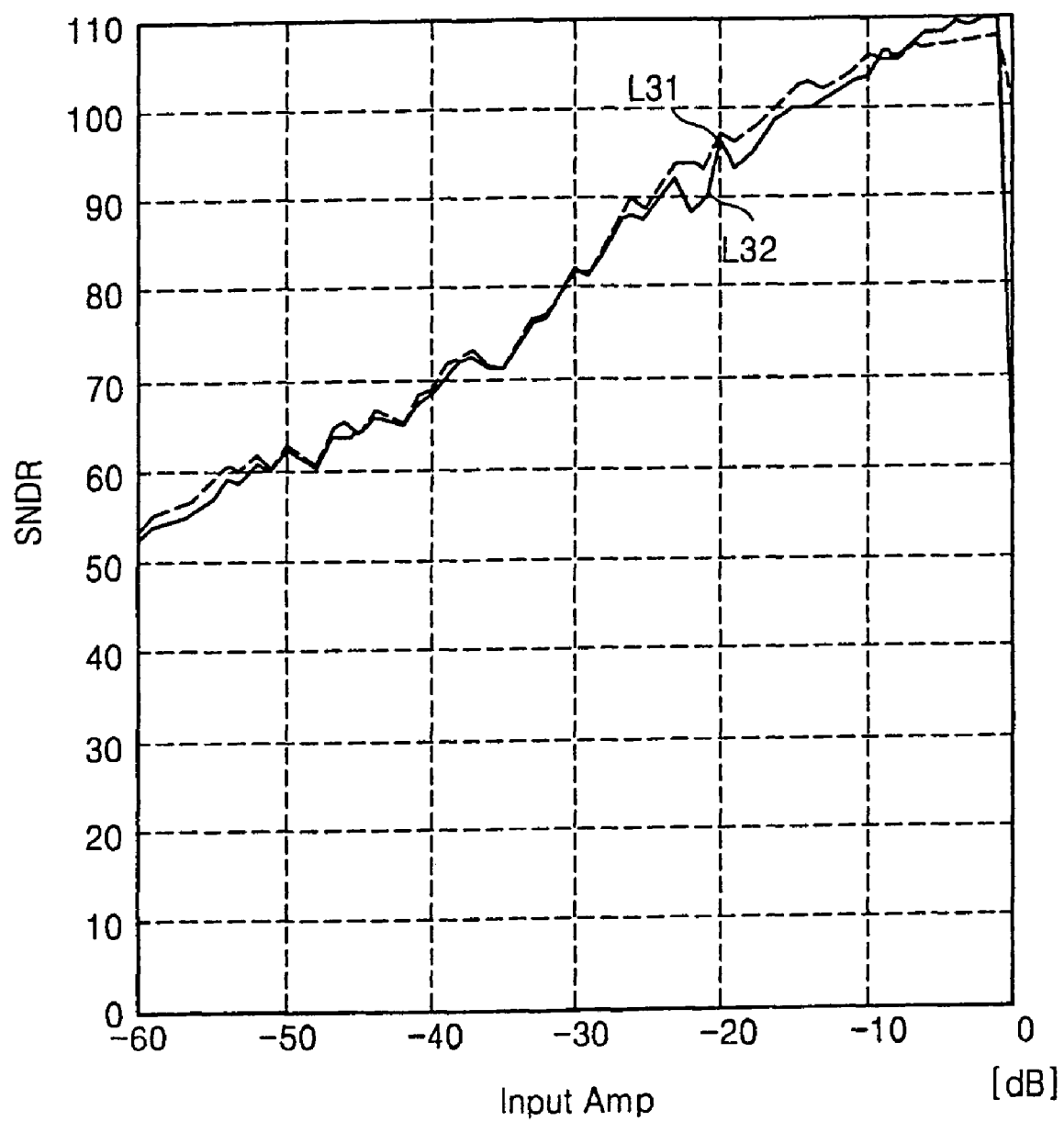
Figure 7D:
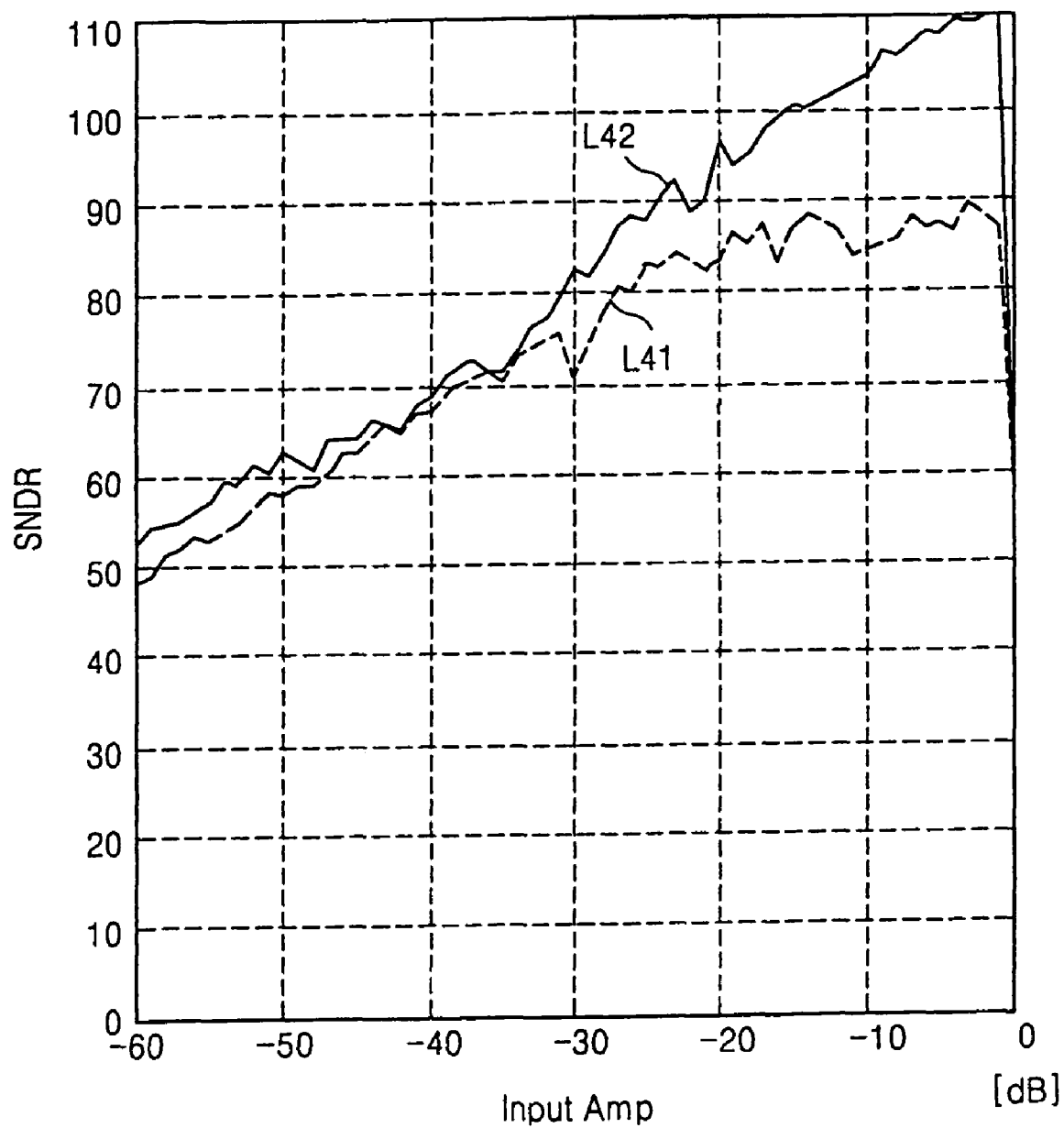

FIGS. 7A, 7B, and 7C are graphs of simulation results for comparing a SNDR in a PWM signal generator according to an embodiment of the present invention with a SNDR of a conventional PWM signal generator.

FIG. 7A shows a SNDR L11 of the DSM signal DSM_OUTC in a conventional PWM signal generator, i.e., a symmetric-type PWM signal generator and a SNDR L12 of the output signal PWM_OUTC of a symmetric-type PWM mapper. Referring to FIG. 7A, the SNDR L11 of the DSM signal DSM_OUTC is significantly similar to the SNDR L12 of the symmetric PWM signal PWM_OUTC.

FIG. 7B shows a SNDR L21 of the DSM signal DSM_OUT in the PWM signal generator 100 of FIG. 2 and a SNDR L22 of the output signal PWM_OUT of the asymmetric-type PWM mapper 140. Referring to FIG. 7B, the SNDR L22 of the asymmetric PWM signal PWM_OUT that has not undergone error correction is lower than the SNDR L21 of the DSM signal DSM_OUT.

Meanwhile, the SNDR L21 of the DSM signal DSM_OUT of the present invention in FIG. 7B is about 21 dB higher than the SNDR L11 of the conventional DSM signal DSM_OUTC in FIG. 7A. Accordingly, even though the SNDR L22 of the asymmetric PWM signal PWM_OUT of the present invention is lower than the SNDR L21 of the DSM signal DSM_OUT, the SNDR L22 is higher than the SNDR L12 of the conventional PWM signal PWM_OUTC in most of the range where an input amplification is lower than about −20 dB.

In particular, when there is no input signal or an input signal is small, that is, when the input amplification is lower than about −30 dB, the SNDR is greatly increased. However, when the input signal is great, that is, when the input amplification is greater than about −20 dB, the asymmetry error E2 is increased, and therefore, increasing the SNDR is difficult.

FIG. 7C shows a SNDR L31 of the DSM signal DSM_OUT in the PWM signal generator 200 of FIG. 6 and a SNDR L32 of the error-corrected output signal PWM_OUTe of the asymmetric-type PWM mapper 140 in FIG. 6. Referring to FIG. 7C, the SNDR L31 of the DSM signal DSM_OUT is significantly similar to the SNDR L32 of the error-corrected output signal PWM_OUTe of the asymmetric-type PWM mapper 140.

Since the error E2 occurring in the asymmetric-type PWM mapper 140 is significantly eliminated or reduced by the error correction unit 180, the SNDR L32 of the error-corrected output signal PWM_OUTe of the asymmetric-type PWM mapper 140 is similar to the SNDR L31 of the DSM signal DSM_OUT. In addition, the SNDR L32 is remarkably increased compared to the SNDR L22 of the output signal PWM_OUT of the asymmetric-type PWM mapper 140 of FIG. 2 without error correction.

As described above, when the error correction unit 180 for correcting the error E2 caused by asymmetry in the output signal of the asymmetric-type PWM mapper 140 is provided between the DSM 130 and the asymmetric-type PWM mapper 140, influence of the asymmetry error E2 may be eliminated or significantly reduced without affecting DSM characteristics determining the SNDR and entire system characteristics. Accordingly, the SNDR of a DSM signal may be improved from increase of an OSR for a PWM signal.

The PWM signal generators according to the above-described embodiments of the present invention using delta sigma modulation have been described. However, the present invention may also be practiced when asymmetric-type pulse width modulation is embodied without using delta sigma modulation. In other words, the present invention may be practiced without a delta sigma modulator disposed before a PWM mapper. Accordingly, the present invention may also be used in a signal processing apparatus (e.g., audio processing apparatus or amplifiers) using pulse width modulation regardless of the use of delta sigma modulation.

Figure 8:
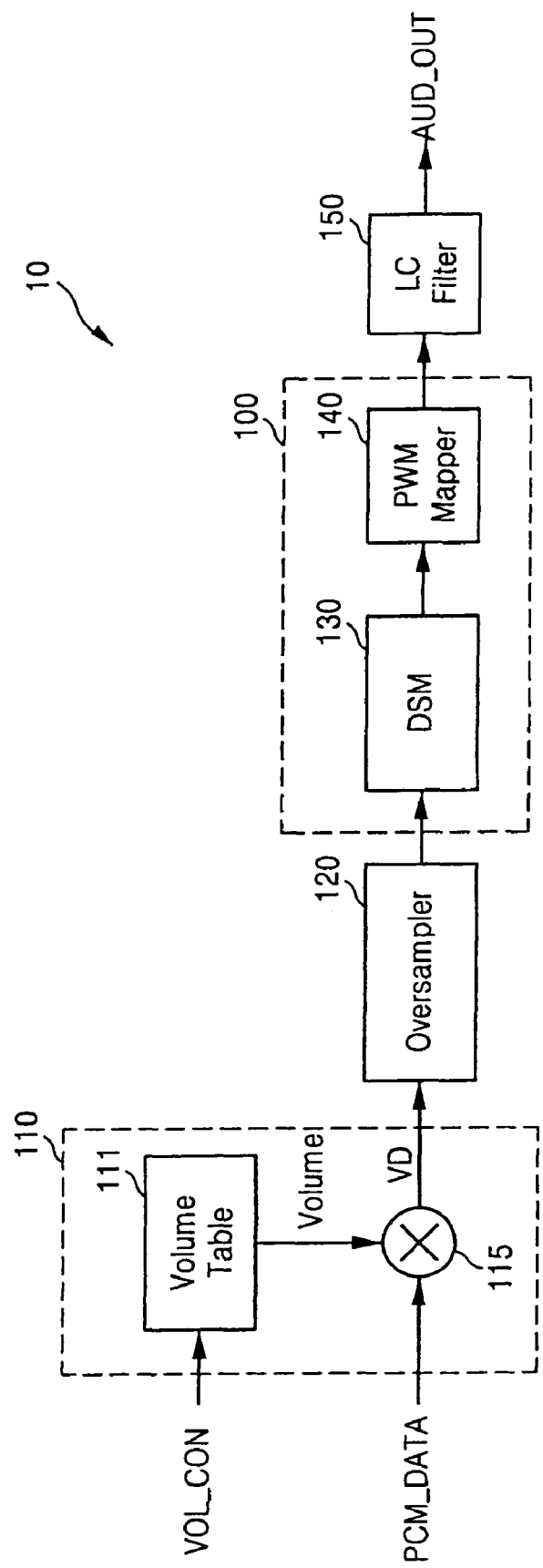
FIG. 8 is a block diagram of an audio data processing apparatus including a PWM signal generator, according to an example embodiment of the present invention.

FIG. 8 is a block diagram of an audio processing apparatus 10 including the PWM signal generator 100 according to an embodiment of the present invention. The audio processing apparatus 10 includes a volume control block 110, an over-sampler 120, the PWM signal generator 100, and a low-pass filter 150. The present invention may also be practiced with the PWM signal generator 100 being replaced by the PWM signal generator 200 of FIG. 6.

The volume control block 110 includes a volume table 111 and a multiplier 115, in an example embodiment of the present invention. The volume table 111 outputs a volume value in response to a volume control signal VOL_CON. The volume value is a level control value for controlling the level of the PCM data PCM_DATA.

The volume table 111 stores a table for mapping volume control signals VOL_CON to volume values. When a user of the audio processing apparatus 10 controls the volume of an audio signal, the volume control signal VOL_CON corresponding to the user's control is generated. The volume control signal VOL_CON is a digital code composed of a plurality of bits. For example when the volume control signal VOL_CON is composed of 4 bits, volume can be controlled at 16 levels.

The multiplier 115 multiplies the PCM data PCM_DATA by the volume value and outputs volume-controlled PCM data VD. In other words, the multiplier 115 amplifies or attenuates the level of the PCM data PCM_DATA according to the volume value. When the volume value is greater than 1 (i.e., 0 dB), the level of the PCM data PCM_DATA is amplified. When the volume is less than 1 (0 dB), the level of the PCM data PCM_DATA is attenuated. Usually, a maximum volume value is 1 (0 dB).

The PCM data PCM_DATA may be obtained by performing PCM (pulse code modulation) on a signal resulting from sampling an analog audio signal (i.e., a sampled signal) at a predetermined sampling rate (e.g., a prior sampling rate=48 kHz). The PCM data PCM_DATA may be composed of a plurality of bits, e.g., 16 or 20 bits.

The over-sampler 120 over-samples an output of the volume control block 110 (i.e., a sampled signal) at a frequency higher than the audio signal sampling frequency (e.g., a prior sampling rate=48 kHz). The over-sampling frequency may be, for example, 16-, 32-, or 64-fold of the audio signal sampling frequency (e.g., 48 kHz). In other words, an over-sampling rate may be a factor of 16, 32, or 64. Accordingly, the over-sampling rate in the PWM signal generator of the present invention may be twice of that in a conventional symmetric-type PWM signal generator.

The PWM signal generator 100 includes the DSM 130 and the PWM mapper 140 similar as described above. Since the components and operations of the PWM signal generator 100 have been described in detail before, detailed descriptions thereof are omitted here. When the PWM signal generator 200 of FIG. 5 replaces the PWM signal generator 100 in FIG. 8, the error correction unit 180 would be inserted between the DSM 130 and the PWM mapper 140.

The low-pass filter 150 performs low-pass filtering on the PWM signal PWM_OUT from the PWM signal generator 100 to generate an audio signal AUD_OUT. The low-pass filter 150 may be implemented by an LC filter.

As described above, according to the present invention, the operating frequency of the quantizer 133 of the delta sigma modulator 130 for generating the quantized signal input by the pulse width modulator 140, is increased higher than the central frequency of the pulse width modulator 140 which is the frequency of the ramp signal RAMP so as to generate the asymmetric PWM signal for increasing the SNDR. In addition, the error occurring from the asymmetry of the asymmetric PWM signal from the pulse width modulator 140 is corrected.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A pulse width modulation (PWM) signal generator comprising:
   a quantizer for generating a quantized signal by quantizing an input signal;
   an asymmetric pulse width modulator that generates an asymmetric PWM signal by comparing the quantized signal with a reference signal, with the asymmetric PWM signal being asymmetric with respect to a center of a period of the reference signal; and
   an error correction unit coupled between the quantizer and the asymmetric pulse width modulator to correct an error generated from the asymmetry of the asymmetric PWM signal.

2. The PWM signal generator of claim 1, wherein the error correction unit has a transfer function that is one of an inverse of a transfer function of the asymmetric pulse width modulator or an inverse of a transfer function of the error generated from the asymmetry of the asymmetric PWM signal.

3. The PWM signal generator of claim 1, wherein the error correction unit has a transfer function of $1+Z^{-1}$.

4. The PWM signal generator of claim 1, wherein the error correction unit includes:
   a delayer for delaying the quantized signal to generate a delayed quantized signal; and
   an adder for adding the quantized signal with the delayed quantized signal to generate an input to the asymmetric pulse width modulator.

5. The PWM signal generator of claim 1, further comprising:
   a delta sigma modulator, including the quantizer, for generating the quantized signal with delta sigma modulation.

6. The PWM signal generator of claim 5, wherein the delta sigma modulator generates the quantized signal with a first clock frequency that is two times a frequency of the reference signal that is a ramp signal.

7. The PWM signal generator of claim 5, wherein the error correction unit is coupled in open loop between the delta sigma modulator and the asymmetric pulse width modulator.

8. A data processing apparatus having pulse width modulation, the data processing apparatus comprising:
   an over-sampler for generating an over-sampled signal by sampling a sampled signal at a sampling rate that is N-times a prior sampling rate for generating the sampled signal, wherein N is an integer that is greater than or equal to 2; and
   a pulse width modulation (PWM) signal generator including:
      a quantizer for generating a quantized signal by quantizing the over-sampled signal;
      an asymmetric pulse width modulator that generates an asymmetric PWM signal by comparing the quantized signal with a reference signal, with the asymmetric PWM signal being asymmetric with respect to a center of a period of the reference signal; and
      an error correction unit coupled between the quantizer and the asymmetric pulse width modulator to correct an error generated from the asymmetry of the asymmetric PWM signal.

9. The data processing apparatus of claim 8, wherein the error correction unit has a transfer function that is one of an inverse of a transfer function of the asymmetric pulse width modulator or an inverse of a transfer function of the error generated from the asymmetry of the asymmetric PWM signal.

10. The data processing apparatus of claim 8, wherein the error correction unit has a transfer function of $1+Z^{-1}$.

11. The data processing apparatus of claim 8, wherein the error correction unit includes:
   a delayer for delaying the quantized signal to generate a delayed quantized signal; and
   an adder for adding the quantized signal with the delayed quantized signal to generate an input to the asymmetric pulse width modulator.

12. A pulse width modulation (PWM) signal generator comprising:
   a quantizer for generating a quantized signal by quantizing an input signal synchronized to a first clock signal, and wherein the input signal has a first period; and
   an asymmetric pulse width modulator that generates an asymmetric PWM signal by comparing the quantized signal with a reference signal synchronized to a second clock signal, with the asymmetric PWM signal being asymmetric with respect to a center of a second period of the reference signal,
   wherein the first clock signal has a higher frequency than the second clock signal, and wherein the first period of the input signal is less than the second period of the reference signal.

13. The PWM signal generator of claim 12, wherein the first clock signal has a frequency that is two times a frequency of the second clock signal.

14. The PWM signal generator of claim 13, wherein the reference signal is a ramp signal having the second period, and wherein the quantized signal has two different levels for two halves of the second period of the ramp signal, and wherein the asymmetric PWM signal is generated by comparing the two different levels with the ramp signal.

15. The PWM signal generator of claim 12, further comprising:
   a delta sigma modulator, including the quantizer, for generating the quantized signal with delta sigma modulation.

16. The PWM signal generator of claim 15, wherein the input signal is generated from an over-sampler sampling a sampled signal at a sampling rate that is N-times a prior sampling rate for generating the sampled signal, with N being an integer that is greater than or equal to 2, and wherein the delta sigma modulator includes:
   an adder for adding the input signal and the quantized signal; and
   a loop filter for filtering an output of the adder to generate a filtered signal input by the quantizer.

17. The PWM signal generator of claim 15, further comprising:
   an error correction unit coupled between the delta sigma modulator and the asymmetric pulse width modulator, wherein the error correction unit has a transfer function that is one of an inverse of a transfer function of the asymmetric pulse width modulator or an inverse of a transfer function of the error generated from the asymmetry of the asymmetric PWM signal.

18. A method of generating a pulse width modulation (PWM) signal, the method comprising:
   quantizing an input signal to generate a quantized signal;
   generating an asymmetric PWM signal by an asymmetric pulse width modulator comparing the quantized signal with a reference signal, with the asymmetric PWM signal being asymmetric with respect to a center of a period of the reference signal; and
   correcting by an error correction unit for an error generated from the asymmetry of the asymmetric PWM signal, wherein the PWM signal generated by the asymmetric pulse width modulator remains asymmetric even after the error correction by the error correction unit.

19. The method of claim 18, wherein said error is corrected with an error correction unit having a transfer function of $1+Z^{-1}$.

20. The method of claim 19, wherein the quantized signal is generated by a delta sigma modulator synchronized to a first clock frequency that is two times a frequency of the reference signal that is a ramp signal.

21. The method of claim 20, wherein the asymmetric PWM signal is generated by an asymmetric pulse width modulator, and wherein the error correction unit is coupled in open loop between the delta sigma modulator and the asymmetric pulse width modulator.

22. A method of generating a pulse width modulation (PWM) signal, the method comprising:
   generating a quantized signal by quantizing an input signal synchronized to a first clock signal, and wherein the input signal has a first period; and
   generating an asymmetric PWM signal by comparing the quantized signal with a reference signal synchronized to a second clock signal, with the asymmetric PWM signal being asymmetric with respect to a center of a second period of the reference signal,
   wherein the first clock signal has a higher frequency than the second clock signal, and wherein the first period of the input signal is less than the second period of the reference signal.

23. The method of claim 22, wherein the first clock signal has a frequency that is two times a frequency of the second clock signal.

24. The method of claim 23, wherein the reference signal is a ramp signal having the second period, and wherein the quantized signal has two different levels for two halves of the second period of the ramp signal, and wherein the asymmetric PWM signal is generated by comparing the two different levels with the ramp signal.

25. The method of claim 22, further comprising:
   correcting for an error generated from the asymmetry of the asymmetric PWM signal.

* * * * *